(12) United States Patent
Sukegawa

(10) Patent No.: US 8,000,927 B2
(45) Date of Patent: Aug. 16, 2011

(54) DATA REMAINING PERIOD MANAGEMENT DEVICE AND METHOD

(75) Inventor: Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 609 days.

(21) Appl. No.: 12/107,984

(22) Filed: Apr. 23, 2008

(65) Prior Publication Data

US 2008/0270072 A1    Oct. 30, 2008

(30) Foreign Application Priority Data

Apr. 24, 2007    (JP) ................. 2007-114314

(51) Int. Cl.
*G06F 17/18*    (2006.01)

(52) U.S. Cl. ........................... 702/179; 702/182; 714/48

(58) Field of Classification Search .................... 702/79, 702/80, 127, 176, 178, 179, 182, 194, 196, 702/199; 714/48, 718

See application file for complete search history.

(56) References Cited

U.S. PATENT DOCUMENTS

| | | | |
|---|---|---|---|
| 6,694,460 B2 | 2/2004 | Katayama et al. | |
| 7,200,523 B1 * | 4/2007 | Yeh et al. | ..................... 702/182 |
| 2005/0193284 A1 | 9/2005 | Yasuo | |

FOREIGN PATENT DOCUMENTS

JP    2005-221413    8/2005

OTHER PUBLICATIONS

U.S. Appl. No. 12/391,583, filed Feb. 24, 2009, Sukegawa, et al.

* cited by examiner

*Primary Examiner* — John H Le
(74) *Attorney, Agent, or Firm* — Oblon, Spivak, McClelland, Maier & Neustadt, L.L.P.

(57) ABSTRACT

A remaining period management device according to an example of the invention includes a statistic calculation unit that measures sampling data associated with monitoring target data stored in a storage device having a finite data remaining period and calculates sampling statistical data based on a measurement result of the sampling data. The device also includes a remaining period detection unit that obtains remaining period data indicative of a data remaining period of the monitoring target data based on predetermined remaining period characteristic data indicative of a characteristic that statistical data varies with elapse of data remaining period and the sampling statistical data calculated by the statistic calculation unit.

9 Claims, 8 Drawing Sheets

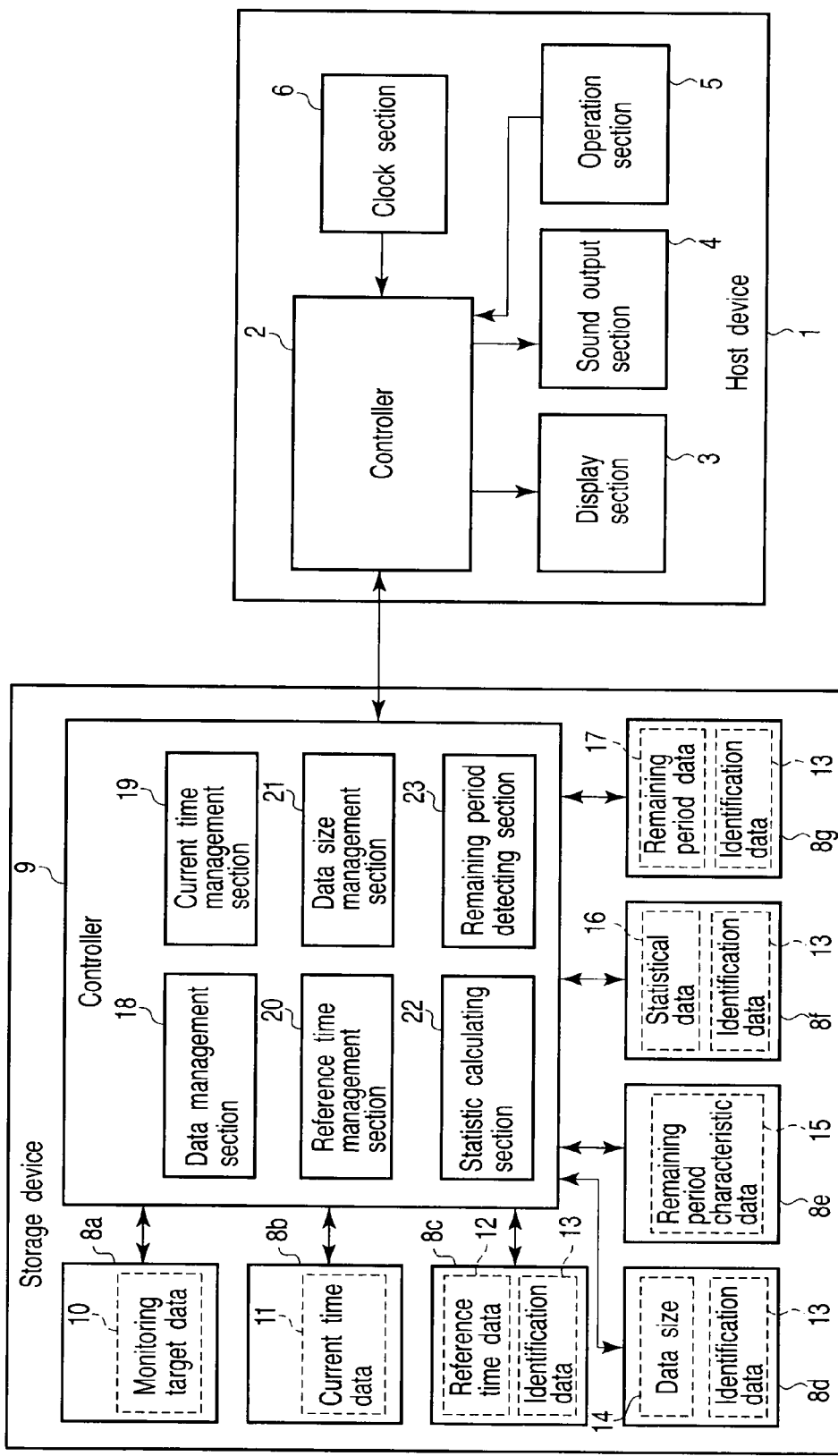
F I G. 1

DATA REMAINING PERIOD MANAGEMENT DEVICE AND METHOD

CROSS-REFERENCE TO RELATED APPLICATIONS

This application is based upon and claims the benefit of priority from prior Japanese Patent Application No. 2007-114314, filed Apr. 24, 2007, the entire contents of which are incorporated herein by reference.

BACKGROUND OF THE INVENTION

1. Field of the Invention

The present invention relates to a data remaining period management device and method which manage a data remaining period of a memory having a finite data remaining period (a period where storage is maintained).

2. Description of the Related Art

Patent Document 1 (JP-A 2005-221413 (KOKAI)) discloses a failure prediction method of predicting a failure of a component that is degraded with time in an electronic apparatus formed of the component that is degraded with time.

In the failure prediction method according to this Patent Document 1, a higher environmental load than that in a regular use state is given to a component degraded with time, an abnormality of the component degraded with time to which the high environmental load is given is detected, and a failure of the component degraded with time is predicted based on this detected abnormality.

When using a picture/sound recorder that stores data as a storage device having a finite data remaining period, a user must confirm written contents in, e.g., an instruction manual and save/manage data while paying attention to the data remaining period of this storage device.

When the storage device having a finite data remaining period adopts a higher density or a new method, the data remaining period tends to be shorter than that in the conventional storage device.

In this case, the need for paying attention to the data remaining period by the user is increased. The user must perform an operation associated with the data remaining period in accordance with a guidance of, e.g., an instruction manual. For example, the user must perform secondary storage or permanent storage of data before the data remaining period passes in order to assuredly save the data.

Patent Document 1 discloses the method of predicting a failure of a component constituting an electronic apparatus, but does not examine a data remaining period of data stored in a storage device having a finite data remaining period.

BRIEF SUMMARY OF THE INVENTION

A remaining period management device according to an example of the invention comprises a statistic calculation unit that measures sampling data associated with monitoring target data stored in a storage device having a finite data remaining period and calculates sampling statistical data based on a measurement result of the sampling data, and a remaining period detection unit that obtains remaining period data indicative of a data remaining period of the monitoring target data based on predetermined remaining period characteristic data indicative of a characteristic that statistical data varies with elapse of data remaining period and the sampling statistical data calculated by the statistic calculation unit.

BRIEF DESCRIPTION OF THE SEVERAL VIEWS OF THE DRAWING

FIG. 1 is a block diagram showing an example of a structure of a storage device including a data remaining period management device according to a first embodiment of the present invention and that of a host device;

DETAILED DESCRIPTION OF THE INVENTION

Figure 2:
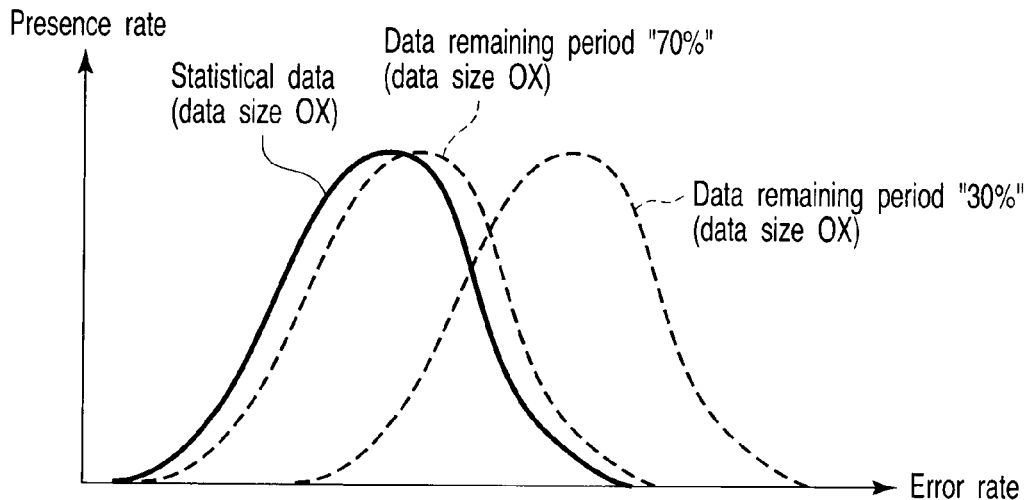
FIG. 2 is a conceptual view showing a first example of a data remaining period detection method by a remaining period detecting section according to the first embodiment.

Respective embodiments according to the present invention will now be explained hereinafter with reference to the accompanying drawings. It is to be noted that like reference numerals denote substantially the same functions and constituent elements and a tautological explanation will be given when required in the following description.

First Embodiment

In this first embodiment, a description will be given as to a data remaining period management device that manages a data remaining period in order to display the data remaining period with respect to a storage device having a finite data remaining period.

FIG. 1 is a block diagram showing an example of a structure of a storage device including a data remaining period management device according to this embodiment and that of a host device.

A host device 1 is a picture/sound recorder, e.g., a video camcorder. The host device 1 includes a controller 2, a display section 3, a sound output section 4, an operating section 5, and a clock section 6. The host device 1 transmits various commands, data to be written, current time data 11 acquired from the clock section 6, and others to a storage device 7 under control by the controller 2. The host device 1 receives various kinds of data, e.g., read data from the storage device 7, displays picture data in the received data in the display section 3, and outputs sound data in the received data through the sound output section 4. The host device 1 inputs operation data obtained by a user from the operating section 5.

The storage device 7 is, e.g., a memory card for the host device 1, and includes memories (storage elements) 8a to 8g and a controller 9.

The memory 8a stores data, e.g., picture/sound recording data. As the memory 8a, an NAND flash memory is used, for example. In this embodiment, data written in this memory 8a is determined as monitoring target data 10.

The memory 8b stores current time data 11.

The memory 8c stores reference time data 12 indicative of a time that the monitoring target data 10 is stored or updated in the memory 8a or a time that the monitoring target data 10 is filmed in association with identification data 13 of the monitoring target data 10

The memory 8d stores a data size (a file size) 14 of the monitoring target data 10 in association with the identification data 13 of the monitoring target data 10.

The memory 8e stores remaining period characteristic data 15 indicative of a characteristic that a remaining level of data is lowered with time.

It is to be noted that the memory 8e may be omitted and processing using contents of the remaining period characteristic data 15 may be incorporated in a remaining period detecting section 23 in the controller 9.

The memory 8f stores statistical data 16 calculated by a statistic calculating section 22 in the controller 9 in association with the identification data 13 of the monitoring target data 10.

The memory 8g stores remaining period data 17 indicative of a data remaining period of the monitoring target data 10 obtained by the remaining period detecting section 23 in the controller 9 in association with the identification data 13 of the monitoring target data 10.

It is to be noted that the memories 8a to 8g can be freely combined.

The controller 9 includes a data management section 18, a current time management section 19, a reference time management section 20, a data size management section 21, the statistic calculating section 22, and the remaining period detecting section 23.

Of these sections, main constituent elements for the data remaining period management device are the statistic calculating section 22 and the remaining period detecting section 23.

The data management section 18 executes writing processing of writing data received from the host device 1 into the memory 8a in accordance with a write command received from the host device 1 and reading processing of reading data from the memory 8a to be transmitted to the host device 1 in response to a read command received from the host device 1.

The current time management section 19 stores the current time data 11 received from the host device 1 in the memory 8b.

When the monitoring target data 10 is written in the memory 8a, the reference time management section 20 accesses the current time data 11 in the memory 8b and stores in the memory 8c the reference time data 12 indicative of a reference time (e.g., a time that the monitoring target data 10 is written or a time that the monitoring target data 10 is filmed) in association with the identification data 13 of the monitoring target data 10.

When the monitoring target data 10 is written in the memory 8a, the data size management section 14 stores in the memory 8d a data size 14 of the monitoring target data 10 in association with the identification data 13 of the monitoring target data 10.

The statistic calculating section 22 measures sampling data for the monitoring target data 10 with respect to the memory 8a, calculates the statistical data 16 concerning a measurement result, and stores in the memory 8f the statistical data 16 associated with the identification data 13 of the monitoring target data 10.

In this embodiment, the statistic calculating section 22 calculates a presence rate of the sampling data with respect to an error rate.

Specifically, the statistic calculating section 22 reads the sampling data concerning the monitoring target data 10 from the memory 8a and detects the number of pieces of error data included in the sampling data.

The statistic calculating section 22 divides the detected number of pieces of error data by a data length of the entire sampling data to calculate an error rate.

The statistic calculating section 22 performs this calculation of the error rate more than once with respect to a plurality of different pieces of sampling data.

In regard to each error rate, the statistic calculating section 22 counts the number of pieces of sampling data having the error rate.

Further, the statistic calculating section 22 divides the number of pieces of sampling data with respect to each error rate by a total number of times of calculating the error rate to obtain a presence rate of the sampling data with respect to each error rate.

For example, when a data length of the sampling data is 512 bytes and error data detected from this sampling data is 2 bytes, an error rate is $1/256$. Furthermore, when the error rate of $1/256$ is obtained five times in a total of 100 times of calculating the error rate, a presence rate of the sampling data having the error rate of $1/256$ is $1/20$.

It is to be noted that the number of pieces of error data may be used in place of the error rate, or the number of pieces of sampling data may be used in place of the presence rate of the sampling data. Moreover, the statistic calculating section 22 makes reference to the current time data 11 and the reference time data 12 when required in statistical processing.

The memory 8e stores the remaining period characteristic data 15. The remaining period characteristic data 15 is indicative of a characteristic that the statistical data varies with time after writing data in the memory 8a.

As the remaining period characteristic data 15, for example, a pattern representing a relationship between an error rate and a presence rate of sampling data predicted in each of various data remaining periods (a period from a current time point to a time point that data deteriorates so that reliability of the data cannot be assured) is used. That is, The remaining period characteristic data 15 includes a relationship pattern of an error rate and a presence rate for each data remaining period.

Additionally, in this embodiment, it is assured that the remaining period characteristic data 15 includes a relationship pattern of a data remaining period, an error rate, a presence rate and data size.

The remaining period detecting section 23 obtains a data remaining period of the monitoring target data 10 based on the remaining period characteristic data 15 stored in the memory 8e, the statistical data 16 of the monitoring target data 10 stored in the memory 8f, and the data size 14 of the monitoring target data 10 stored in the memory 8d, and stores in the memory 8g the remaining period data 17 in association with the identification data 13 of the monitoring target data 10.

Further, the remaining period detecting section 23 makes reference to the current time data 11 and the reference time data 12 when required in processing of obtaining a data remaining period.

For example, the remaining period detecting section 23 obtains a data remaining period of the monitoring target data 10 based on the similarity of a relationship between an error rate and a presence rate indicated by the statistical data 16 of the monitoring target data 10 and a relationship pattern of an error rate and a presence rate with respect to each of several data remaining periods indicated by the remaining period characteristic data 15 with respect to the data size 14 of the monitoring target data 10.

Here, as a method of detecting a data remaining period based on a similarity judgment, for example, a relationship pattern that a square of a difference from a relationship represented by the statistical data 16 becomes minimum is selected from relationship patterns associated with the data size 14 of the monitoring target data 10, and a current data remaining period is estimated based on a data remaining period associated with this selected relationship pattern.

FIG. 2 is a conceptual view showing a first example of a data remaining period detection method by the remaining period detecting section 23 according to this embodiment.

The remaining period characteristic data 15 has a relationship pattern indicative of a relationship between an error rate and a presence rate in accordance with each data remaining period.

The statistical data 16 is indicative of a relationship between an error rate and a presence rate of sampling data.

The remaining period detecting section 23 obtains a data remaining period based on a relationship pattern whose shape is closest to that of the statistical data 16.

Figure 3:
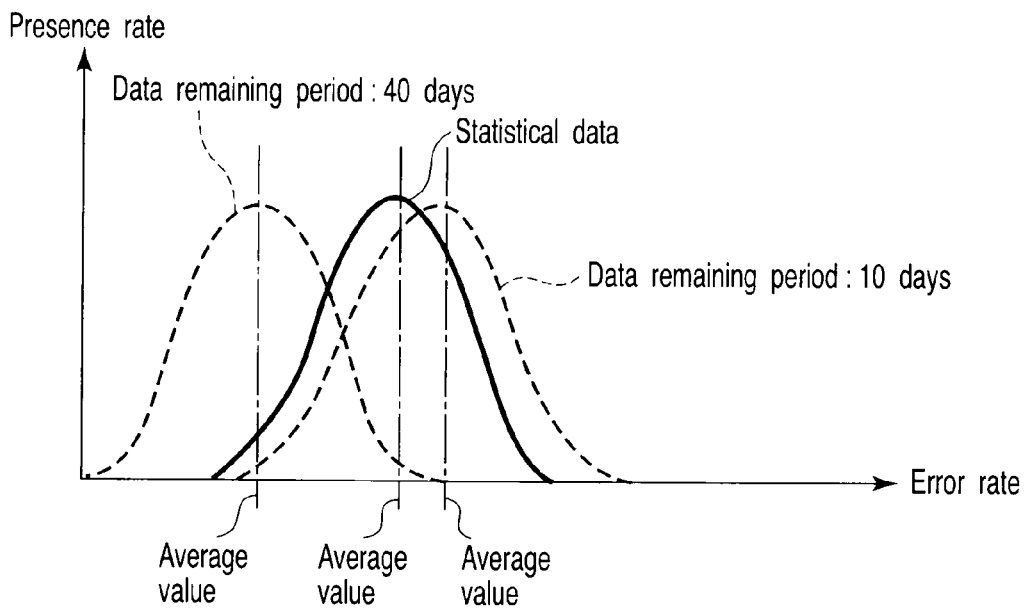
FIG. 3 is a conceptual view showing a second example of the data remaining period detection method by the remaining period detecting section according to the first embodiment.

FIG. 3 is a conceptual view showing a second example of the data remaining period detection method by the remaining period detecting section 23 according to this embodiment.

The remaining period characteristic data 15 has average values of distributions for various kinds of data remaining periods, for example. In this case, the remaining period detecting section 23 determines a data remaining period in the remaining period characteristic data that has an average value to which an average value of a distribution of the statistical data 16 is close, and obtains a data remaining period based on the closest data remaining period.

Figure 4:
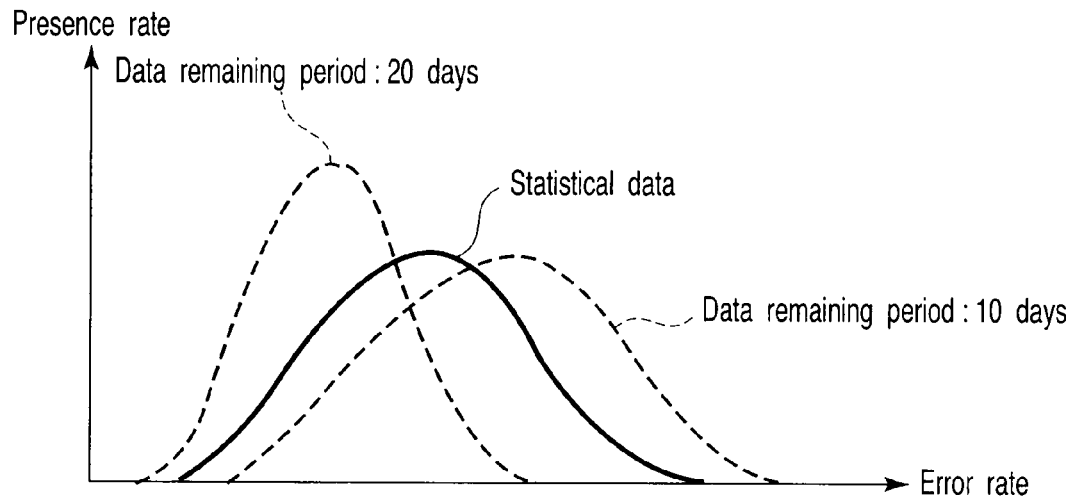
FIG. 4 is a conceptual view showing a third example of the data remaining period detection method by the remaining period detecting section according to the first embodiment.

FIG. 4 is a conceptual view showing a third example of the data remaining period detection method by the remaining period detecting section 23 according to this embodiment.

The remaining period characteristic data 15 has dispersion values of distributions for various kinds of data remaining periods.

In this case, the remaining period detecting section 23 determines a data remaining period in the remaining period characteristic data 15 that has a dispersion value to which the dispersion value of the statistical data 16 is close, and obtains a data remaining period based on the closest data remaining period.

As explained above, an average value, a dispersion value, and others which can be obtained based on various kinds of statistic analysis can be used as the statistical data 16. The storage device 7 acquires sampling data having the number of samples that can obtain statistical reliability at the present moment, calculates the statistical data 16, e.g., an average value or a dispersion value based on the sampling data, applies a previously stored characteristic that data is lost with elapse of time to this statistical data 16, and obtains a data remaining period of the monitoring target data 10 stored in the memory 8a.

As a modification, the controller 9 in the storage device 7 may count the number of error bits of each sampling data and calculate a capacity for an ECC correction capability to obtain a data remaining period for this capacity.

In this embodiment, when a concordance rate of an average value of a reference time and a current average value is high and a concordance rate of the current average value and an average value when a data remaining periods elapses is low, the remaining period detecting section 23 may determine that a degree of elapse of the data remaining period is small.

In this embodiment, when a current dispersion value is smaller than a dispersion value when a data remaining period elapses, the remaining period detecting section 23 may determine that a degree of elapse of the data remaining period is small. On the other than, when the current dispersion value is close to the dispersion value when the data remaining period elapses, the remaining period detecting section 23 may determine that a degree of elapse of the data remaining period is large.

Figure 5:
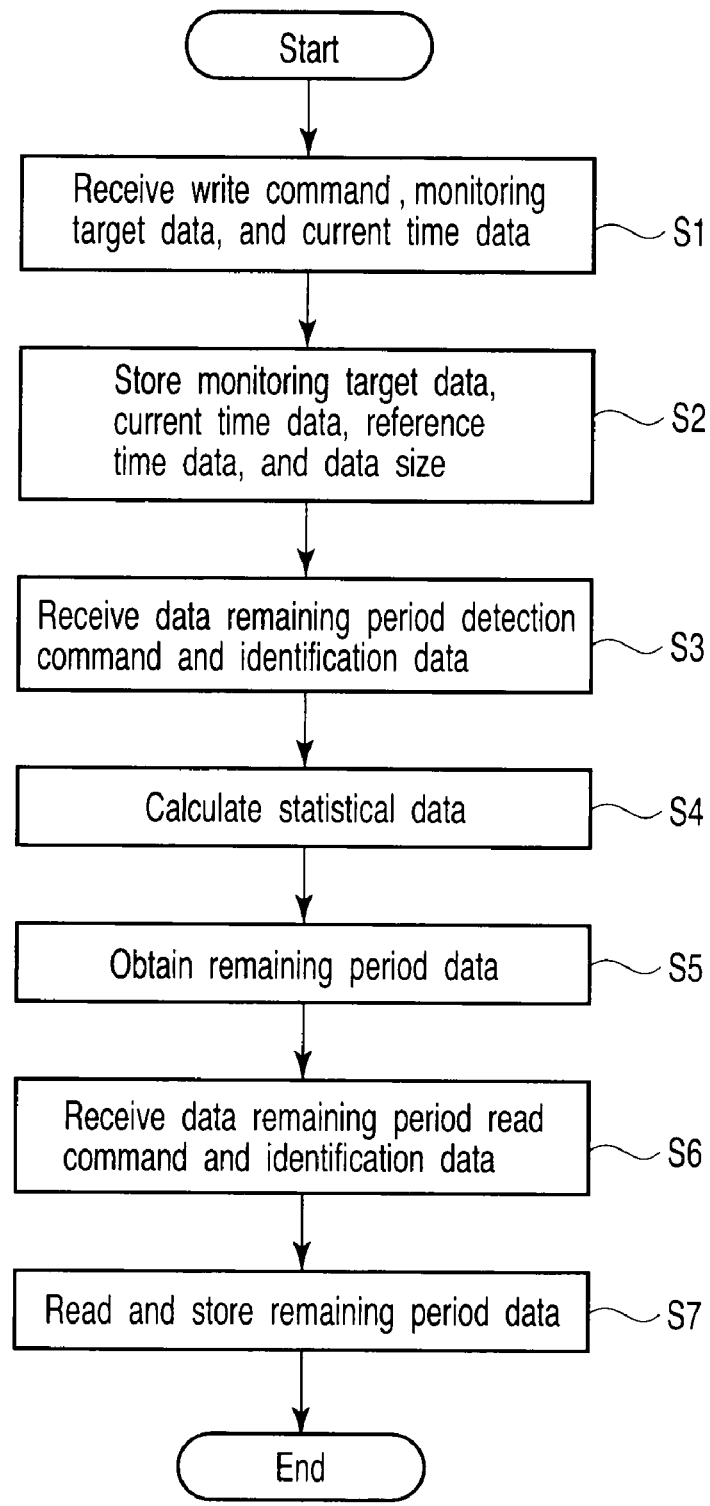
FIG. 5 is a flowchart showing an example of an operation of the storage device according to the first embodiment.

FIG. 5 is a flowchart showing an example of an operation of the storage device 7 according to this embodiment.

At a step S1, the controller 9 in the storage device 7 receives a write command, monitoring target data 10 to be written, and current time data 11 from the controller 2 in the host device 1. It is to be noted that the current time data 11 is likewise received in real time in subsequent processing.

At a step S2, the data management section 18 stores the received monitoring target data 10 in the memory 8a and the current time management section 19 stores the received current time data 11 in the memory 8b in accordance with the write command. It is to be noted that the current time management section 19 updates the memory 8b every time it receives the current time data 11 even in subsequent processing. The reference time management section 20 stores in the memory 8c reference time data 12 indicative of a time at which the monitoring target data 10 is stored in the memory 8a in association with identification data 13 of the monitoring target data 10 based on the received current time data 11. Furthermore, the data size management section 21 stores in the memory 8d a data size 14 of the written data 10 in association with the identification data 13 of the monitoring target data 10.

At a step S3, the controller 9 in the storage device 7 receives a data remaining period detection command and the identification data 13 of the monitoring target data 10 from the controller 2 in the host device 1.

At a step S4, the statistic calculating section 22 measures sampling data for the monitoring target data 10 stored in the memory 8a, obtains an error rate of the sampling data based on a measurement result, calculates a presence rate (a percentage) of the sampling data with respect to the obtained error rate, and stores in the memory 8f statistical data 16 indicative of a relationship between the error rate and the presence rate in association with the identification data 13 of the monitoring target data 10. In calculation of the statistical data 16, the current time data 11 in the memory 8b, the reference time data 12 of the monitoring target data 10 in the memory 8c, and the data size 14 in the memory 8d may be used.

At a step S5, the remaining period detecting section 23 superimposes the relationship between the error rate and the presence rate indicated by the statistical data 16 on a pattern relationship that is indicated by the remaining period characteristic data 15 and corresponds to the data size 14 of the monitoring data 10 to select a relationship pattern having the highest similarity degree based on the statistical data 16 of the monitoring target data 10 stored in the memory 8f, the remaining period characteristic data 15 stored in the memory 8e, and the data size 14 of the monitoring target data 10 stored in the memory 8d, estimates a data remaining period at the present time based on a data remaining period corresponding to the selected relationship pattern, and stores remaining period data 17 in the memory 8g in association with the identification data 13 of the monitoring target data 10. In detection of the remaining period data 17, the current time data 11 in the memory 8b and the reference time data 12 of the monitoring target data 10 in the memory 8c may be used.

At a step S6, the controller 9 in the storage device 7 receives a remaining period read command and the identification data 13 of the monitoring target data 10 from the controller 2 in the host device 1.

At a step S7, the controller 9 in the storage device 7 reads the remaining period data 17 of the monitoring target data 10 from the memory 8g and transmits the read monitoring target data 10 to the host device 1.

Figure 6:
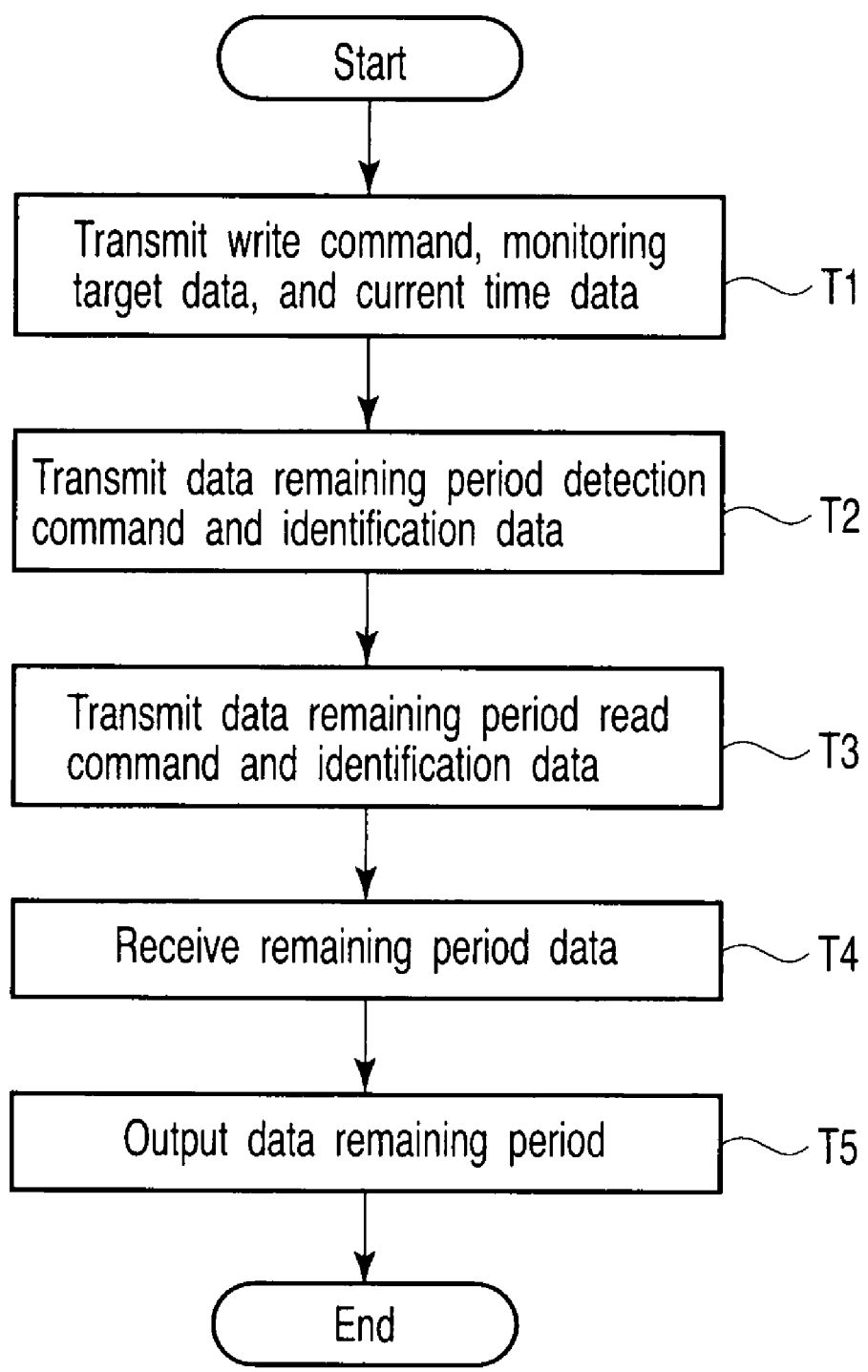
FIG. 6 is a flowchart showing an example of an operation of the host device according to the first embodiment.

FIG. 6 is a flowchart showing an example of an operation of the host device 1 according to this embodiment.

At a step T1, the controller 2 in the host device 1 transmits the write command, the monitoring target data 10 to be written, and the current time data 11 acquired from the clock section 6 to the storage device 7. It is to be noted that the current time data 11 is likewise transmitted in real time in subsequent processing.

At a step T2, the controller 2 in the host device 1 transmits a data remaining period detection command and the identification data 13 indicative of the monitoring target data 1 as a detection target to the storage device 7 in accordance with a data remaining period detection instruction from a user accepted by the operating section 5.

At a step T3, the controller 2 in the host device 1 transmits a data remaining period read command and the identification data 13 of the monitoring target data 10 as a remaining period reading target to the storage device 7 in accordance with a data remaining period read instruction from the user accepted by the operating section 5.

At a step T4, the controller 2 in the host device 1 receives the read remaining period data 17 from the storage device 7.

At a step T5, the controller 2 in the host device 1 displays the data remaining period indicated by the received remaining period data 17 in the display section 3 or outputs the same through the sound output section 4.

It is to be noted that the storage device 7 detects and reads the remaining period data 17 in accordance with the data remaining period detection command and the read command from the controller 2 in the host device 1 in FIGS. 5 and 6, but the controller 9 in the storage device 7 may automatically (e.g., periodically) calculate the statistical data 16, automatically detect the remaining period data 17, and automatically transmit the remaining period data 17.

In this embodiment explained above, the sampling data of the monitoring target data 10 having a finite data remaining period is measured, and a data remaining state is statistically estimated, thereby obtaining an appropriate data remaining period.

In this embodiment, data having the number of samples that can obtain statistical reliability is acquired, the statistical data 16, e.g., an average value or a dispersion value is calculated based on the sampling data, and the statistical data 16 is compared with a characteristic in advance stored that data is lost with elapse of days and hours, thereby estimating a current data remaining period concerning the monitoring target data 10.

It is to be noted that changing a probability used in estimation of a data remaining period in accordance with the data size 14 of the monitoring target data 10 increases accuracy of the data remaining period. Considering file data as the monitoring target data 10, even if a large part of the file data does not include error data, the file data cannot be used when the file data partially includes pieces of error data whose number exceeds an allowable range. In this manner, a probability that the file data includes pieces of error data whose number exceeds the allowable range becomes higher when the data size of the monitoring target data 10 is increased. Therefore, it is necessary to calculate a shorter data remaining period when the data size of the monitoring target data 10 is increased.

In this embodiment, an appropriate data remaining period of the monitoring target data 10 as bulky data can be obtained from a small amount of sampling data.

In this embodiment, a data remaining period can be displayed in an understandable way for a user in the host device 1.

In this embodiment, assuming that the host device 1 is a picture/sound recorder, the host device 1 can display a level of a data remaining period at the present time which is obtained using a picture/sound recorded time point as a reference in accordance with each of file contents. A user can easily confirm the data remaining period in accordance with each of file contents.

In this embodiment, since a relationship between a relationship pattern of an error rate and a presence rate and a data remaining period is determined in accordance with a data size, the data remaining period according to the data size 14 can be appropriately estimated and displayed.

It is to be noted that the recording device 7 uses the current time data 11 acquired from the clock section 6 in the host device 1 to obtain the reference time data 12 in this embodiment, but a time stamp of a data file stored in the memory 8a or time data self-recorded by the storage device 7 may be used to obtain the reference time data 12 instead.

Moreover, in this embodiment, by preventing a user who has once confirmed a data remaining period from making reference to this confirmed data remaining period to confirm the next data remaining period for a long time, a value that is corrected to be shorter to some extent may be intentionally obtained as a data remaining period based on statistical reliability while considering a risk that the monitoring target data 10 is lost.

Second Embodiment

In this embodiment, a first modification of a remaining period characteristic data 15 and an operation of a remaining period detecting section 23 will be explained.

Figure 7:
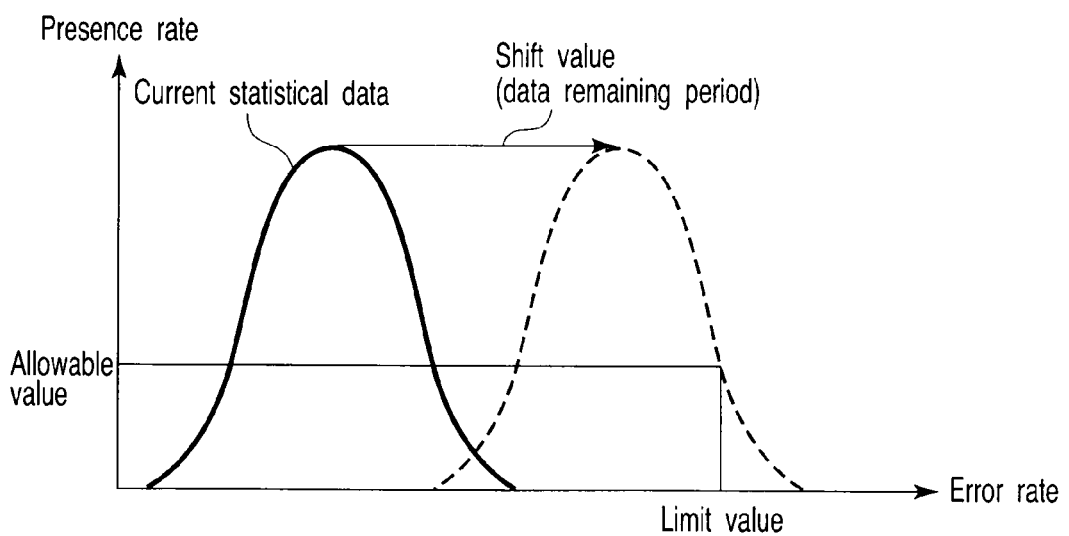
FIG. 7 is a graph showing an example of a relationship between current statistical data and a limit value of an error rate according to a second embodiment of the present invention.

FIG. 7 is a graph showing an example of a relationship between current statistical data 16 and an error rate limit value.

The remaining period characteristic data 15 includes a limit value of an error rate, an allowable value of a presence rate with respect to the limit value, and a data remaining period with respect to a distribution shift value.

The remaining period detecting section 23 shifts a distribution of the current error rate and the presence rate indicated by the statistical data 16 to an error rate limit value side, and obtains a data remaining period that is set with respect to a shift value when the presence rate exceeds the allowable value with respect to the limit value. For example, it is assumed that a longer data remaining period is obtained when the shift value is large.

As a result, in this embodiment, a data remaining period of monitoring target data 10 can be obtained from sampling data.

Third Embodiment

In this embodiment, a second modification of remaining period characteristic data 15 and an operation of a remaining period detecting section 23 will be explained.

Figure 8:
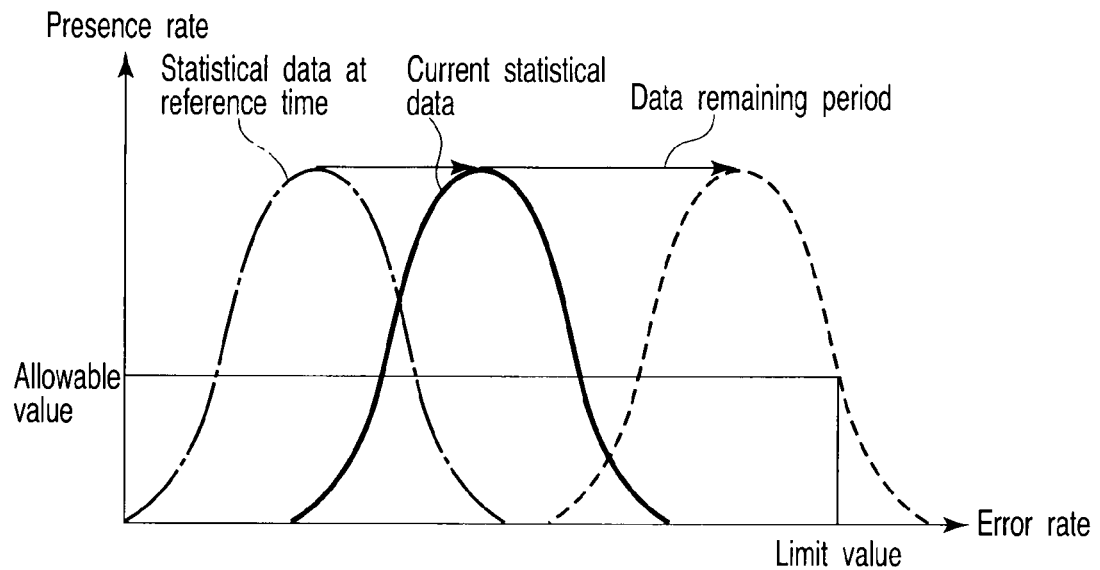
FIG. 8 is a graph showing an example of a relationship between statistical data at a reference time, current statistical data, and a limit value of an error rate according to a third embodiment of the present invention.

FIG. 8 is a graph showing an example of a relationship between statistical data at a reference time, current statistical data 16, and an error rate limit value.

The remaining period characteristic data 15 includes an error rate limit value, and an allowable value of a presence rate with respect to a limit value.

The remaining period detecting section 23 obtains a period required for a current distribution to change to a distribution where a presence value exceeds an allowable value with respect to a limit value based on a state of a change from a distribution of a reference time to the current distribution (e.g., a period from a time where storage is performed to the current time), thereby acquiring a data remaining period.

That is, in this embodiment, sampling data having the number of samples that can obtain necessary reliability is acquired at the reference time, statistical data, e.g., an average value or a dispersion value is calculated/stored based on the sampling data, sampling data is obtained at the current time, the statistical data 16 is calculated based on this data, future statistical data is calculated based on the statistical data at the reference time and the current statistical data, and a data remaining period is acquired based on the future statistical data and a characteristic representing a state after elapse of the data remaining period.

As a result, even in this embodiment, the data remaining period of monitoring target data 10 can be obtained from the sampling data.

Fourth Embodiment

In this embodiment, an example of using a retention characteristic of a memory to obtain a data remaining period will be explained. It is to be noted that this embodiment will be explained on the assumption that a plurality of reading voltages are set and a semiconductor memory including a plurality of nonvolatile memory cells is used. As such a semiconductor memory, for example, an NAND flash memory can be considered.

Figure 9:
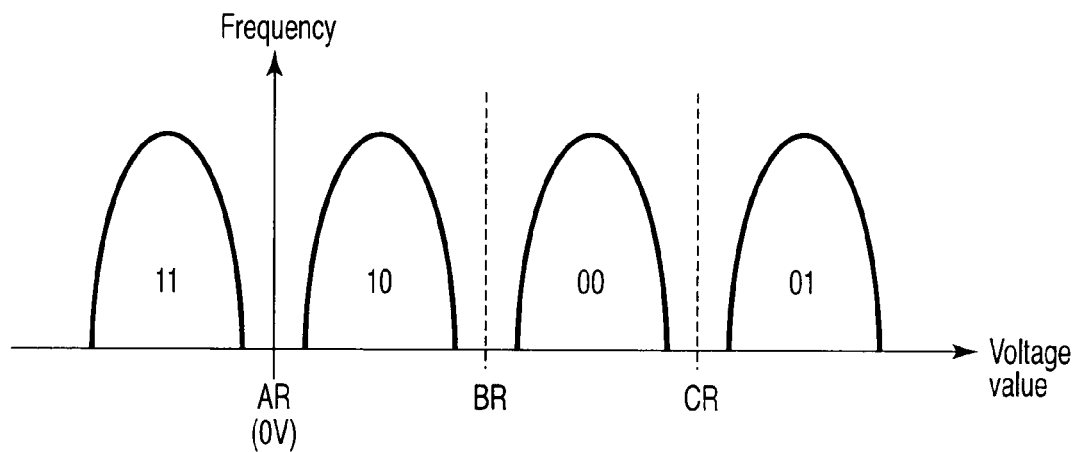
FIG. 9 is a view showing an example of a relationship between a threshold value voltage and the number (a frequency) of memory cells with respect to sampling data.

FIG. 9 is a view showing an example of a relationship between a threshold voltage of memory cells and the number (a frequency) of the memory cells in regard to sampling data.

A first axis depicted in FIG. 9 represents a threshold voltage of the memory cells, a second axis represents the number (a frequency) of the memory cells, and a distribution represents a distribution of the threshold voltage of the memory cells.

Each memory cell switches an ON operation and an OFF operation in accordance with comparison between a reading voltage supplied to a gate electrode and its own threshold voltage.

In FIG. 9, the distribution of the threshold voltage of the memory cells is divided into four, and data of two bits is assigned to each of the four distributions. "11" is assigned to the distribution of the lowest negative threshold voltage, and "10" is assigned to the distribution of the second threshold voltage next higher than the former voltage. Further, "00" is assigned to the distribution of the third threshold voltage next higher than the second voltage, and "01" is assigned to the distribution of the highest threshold voltage. A data value of each memory cell is judged based on a magnitude relationship between the threshold voltage of each memory cell and a reading voltage AR, BR, or CR.

For example, at the time of reading, when the reading voltage AR (0 volt) is supplied to the gate electrode of the memory cell and the memory cell performs the ON operation, a data value stored in this memory cell is determined as "11". Furthermore, when the memory cell performs the OFF operation upon supplying the reading voltage AR to the gate electrode and the memory cell carries out the ON operation upon supplying the reading voltage BR to the gate electrode, a data value of this memory cell is determined as "10". When the memory cell performs the OFF operation upon supplying the reading voltage BR to the gate electrode and the memory cell carries out the ON operation upon supplying the reading voltage CR to the gate electrode, a data value of this memory cell is determined as "00". When the memory cell performs the OFF operation upon supplying the reading voltage CR to the gate electrode, a data value of this memory cell is determined as "01".

In this embodiment, a controller in a storage device performs reading while shifting the reading voltage with respect to sampling data, calculates a capacity that enables normal reading even though the reading voltage AR, BR, or CR is shifted, and obtains a data remaining period with respect to the capacity.

Figure 10:
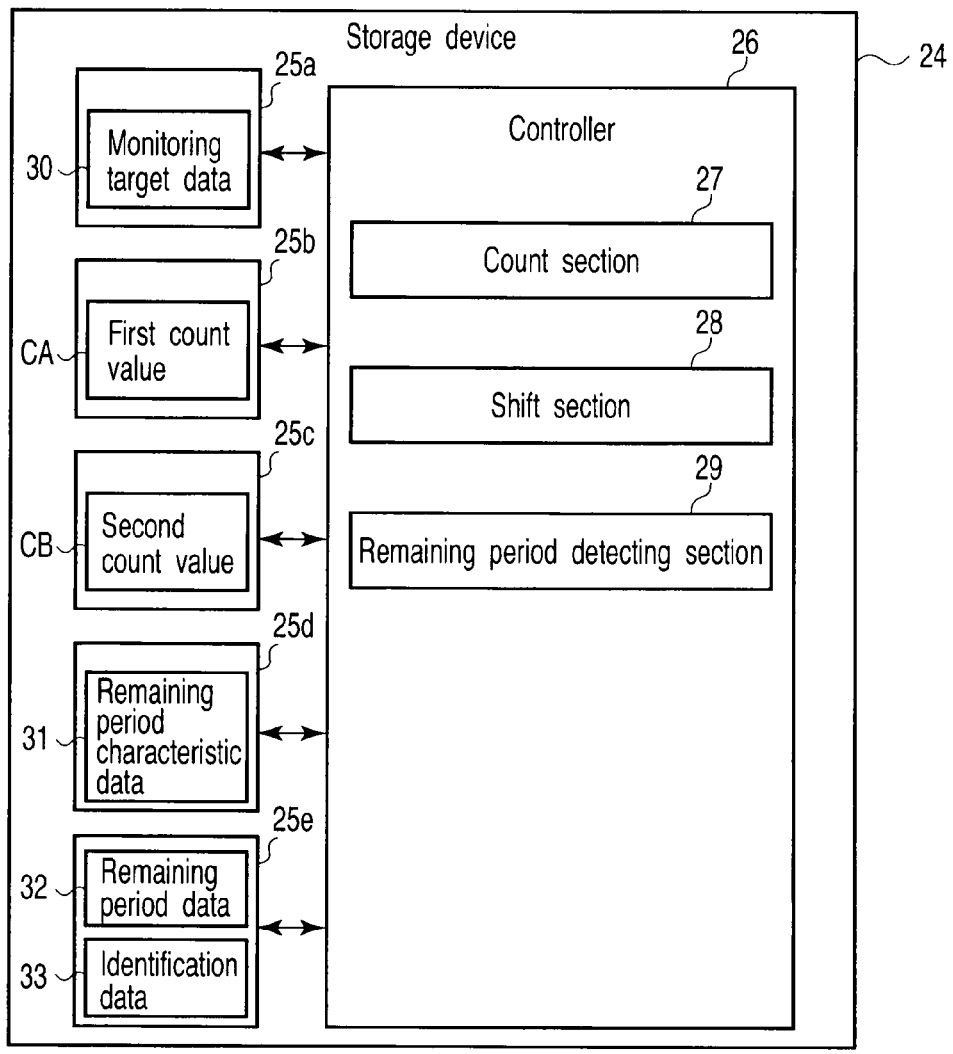
FIG. 10 is a block diagram showing an example of a structure of a storage device including a data remaining period management device according to a fourth embodiment of the present invention.

FIG. 10 is a block diagram showing an example of a structure of the storage device including a data remaining period management device according to this embodiment.

In this embodiment, a storage device 24 includes memories 25a to 25e and a controller 26. It is to be noted that the memories 25a to 25e can be freely combined. The controller 26 includes a count section 27, a shift section 28, and a remaining period detecting section 29.

First, the data retention characteristic of the memory 25a will be explained.

A memory such as an NAND flash memory accumulates an electric charge in a floating gate of a memory cell. This memory controls a threshold voltage of a memory cell to store data in the memory cell.

The floating gate is electrically insulated from the periphery so that the electric charge can be accumulated. However, the electric charge in the floating gate leaks with time although it is a small amount. When the electric charge leaks from the floating gate, the threshold voltage of the memory cell is lowered, and normal data cannot be read from the memory cell in the end.

For instance, in the example depicted in FIG. 9, the memory cell having the data value "01" written therein is in a state where the threshold voltage that enables switching the ON state and the OFF state is higher than the reading voltage CR in the short period after written.

However, when the threshold voltage becomes lower than the reading voltage CR with time, the memory cells performs the ON operation with the reading voltage CR, and the data held in this memory cell is read as a wrong data value "00" rather than "01".

A data remaining period calculation method according to this embodiment utilizing the retention characteristic will now be explained.

A description will be given as to an example where the data value "01" is used to detect a data remaining period.

When monitoring target data 30 is written in the memory 25a, the count section 27 counts the number of data values "01" included in sampling data for this monitoring target data 30, and stores this result as a first count value CA in the memory 25b.

The shift section 28 uses a shift voltage SV slightly higher than the reading voltage CR in place of this reading voltage CR to read the data values "01" in the sampling data, counts the number of memory cells having threshold voltages higher than the shift voltage SV in the memory cells holding the data values "01" in the sampling data, and stores this result as a second count value CB in the memory 25c.

The remaining period detecting section 29 detects a data remaining period with respect to the data value "01" based on the first count value CA stored in the memory 25b, the second count value CB stored in the memory 25c, and remaining period characteristic data 31 stored in the memory 25d, and stores remaining period data 32 indicative of the detected data remaining period in the memory 25e in association with identification data 33 of the monitoring target data 30.

Figure 11:
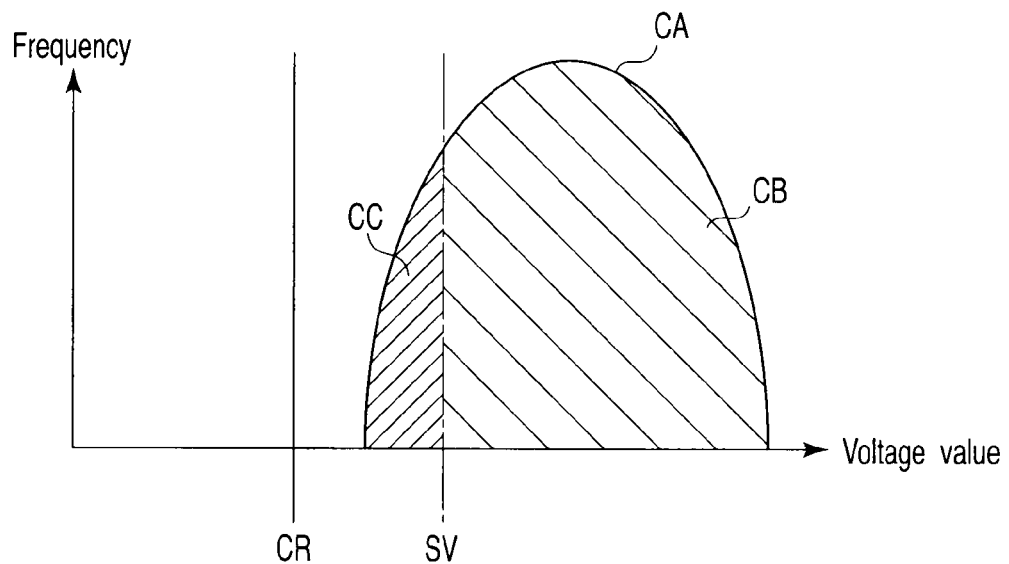
FIG. 11 is a view showing an example of a relationship between a distribution of a threshold value voltage of a data value, a reading voltage CR, and a shift voltage SV.

An example of the data remaining period detection method by the remaining period detecting section 29 will now be explained with reference to FIG. 11.

For example, the remaining period detecting section 29 subtracts the second count value CB from the first count value CA to obtain "the number of memory cells whose data values cannot be recognized as "01" when the accumulated electric charge leaks and the threshold voltages are lowered by an amount corresponding to the shift voltage SV in the memory cells having the data values "01" in the sample data", and determines this result as a third count value CC. The third count value CC is indicative of the number of the memory cells whose threshold values become lower than the shift voltage SV in the memory cells having the data values "01" in the sample data.

Subsequently, the remaining period detecting section 29 divides the third count value CC by the first count value CA to calculate a reading failure rate with respect to the shift voltage SV. This reading failure rate is indicative of a percentage of the memory cells whose data values cannot be recognized as "01" when the accumulated electric charges leaks and the threshold voltages are lowered by an amount corresponding to the shift voltage SV.

For example, the remaining period characteristic data 31 represents a relationship pattern between a reading failure rate and a data remaining period in which the data remaining period becomes shorter when the reading failure rate becomes higher.

The remaining period detecting section 29 detects a data remaining period associated with the calculated reading failure rate based on the remaining period characteristic data 31.

Although the above explains the example where the data value "01" is used to detect a data remaining period, the same technique can be used with respect to the other data values "11", "10", and "00". Moreover, a data remaining period can be detected based on a result obtained by applying the same data remaining period calculation method to the various data values "11", "10", and "00" (e.g., calculating an average or selecting the shortest data remaining period).

Additionally, although a percentage of the third count value with respect to the first count value is obtained as a reading failure rate in the above explanation, a percentage of the second count value CB with respect to the first count value CA may be obtained as a reading enabling rate instead. In this case, the remaining period characteristic data 31 represents a relationship pattern between a reading enabling rate and a data remaining period in which the data remaining period becomes shorter when the reading enabling rate becomes lower.

In this embodiment, a data remaining period of the monitoring target data 30 can be obtained from the sampling data.

Fifth Embodiment

In this embodiment, a display conformation of a data remaining period will be explained.

Figure 12:
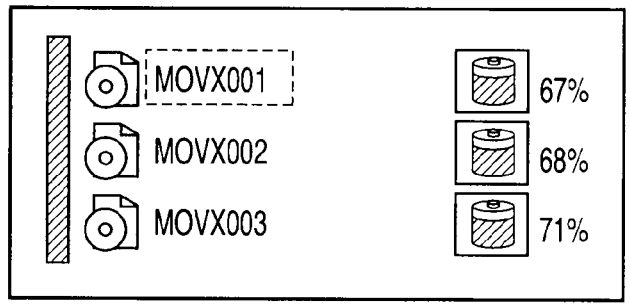
FIG. 12 is a view showing a first display example of a data remaining period according to a fifth embodiment of the present invention.

FIG. 12 is a view showing a first display example of a data remaining period. FIG. 12 shows a display example where a reference time point (e.g., a time point where storage is performed or a time point where imaging is effected) is 100% and a time point where a data remaining period passes is 0% in accordance with each piece of monitoring target data (file contents) and a user is informed of a level of a data remaining period at the current time point that is present between these time points.

For example, assuming that a data retention (data storage) performance of a storage device 7 is 100% at a reference time and it is 0% when a data remaining period passes and monitoring target data 10 cannot be read (e.g., a state where correction is impossible even though ECC is used), a data remaining period is represented by time proportional approximation between 100% and 0%.

It is to be noted that a data remaining period may be displayed in the form of a percentage between 100% and 0% in accordance with a capacity calculated from shifting the threshold value AR, BR, or CR of the reading voltage.

In display of a data remaining period based on a percentage between 100% to 0% or display of a data remaining period based on remaining days, a display conformation that again urges confirmation of the data remaining period when a predetermined period passes may be used in place of accurately displaying a detected value.

As a result, it is possible to urge a user to perform an operation of periodically obtaining a data remaining period from an actual measured value of sampling data. Further, an error between a data remaining period obtained from an actual measured value of sampling data and a data remaining period obtained by an estimation technique, e.g., time proportional approximation can be appropriately eliminated, thereby improving accuracy for the data remaining period.

For example, when a reliability guarantee for a data remaining period calculated from an actual measured value of sampling data is fixed to 30 days, adjustment is carried out to prevent a data remaining period exceeding 30 days from a time point that the sampling data is actually measured from being displayed.

More specifically, for example, it is assumed that a period for urging remeasurement is determined as 30 days or below from the previous measurement and sampling data is measured at a time point where 10 days pass from a reference time. In this case, the next time that remeasurement should be urged is the 40th day from the reference time. A period that has already passed until the current time from the reference time in the 40 days is 10 days.

Thus, a message that 10/(10+30)=¼=25% in the period for holding data has already passed and 75% of the period remains until the next time that remeasurement should be urged is displayed.

Likewise, it is assumed that a period for urging remeasurement is determined as 30 days or below from the previous measurement and sampling data is measured at a time point where 20 days pass from a reference time. In this case, the next time that remeasurement should be urged is the 50th day from the reference time. A period that has already passed until the current time from the reference time in the 50 days is 20 days.

Thus, a message that 20/(20+30)=⅖=40% in the period for holding data has already passed and 40% of the period remains until the next time that remeasurement should be urged is displayed.

Figure 13:
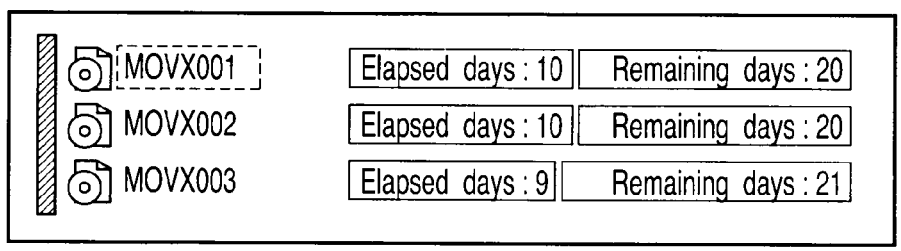
FIG. 13 is a view showing a second display example of the data remaining period according to the fifth embodiment of the present invention.

FIG. 13 is a view showing a second display example of a data remaining period. In FIG. 13, elapsed days from a reference time to the present and remaining days until a time point where the data remaining period passes are displayed in accordance with each piece of monitoring target data (file contents) based on a reference day of the monitoring target data (a time stamp of a file created date) and current time data 11.

Figure 14:
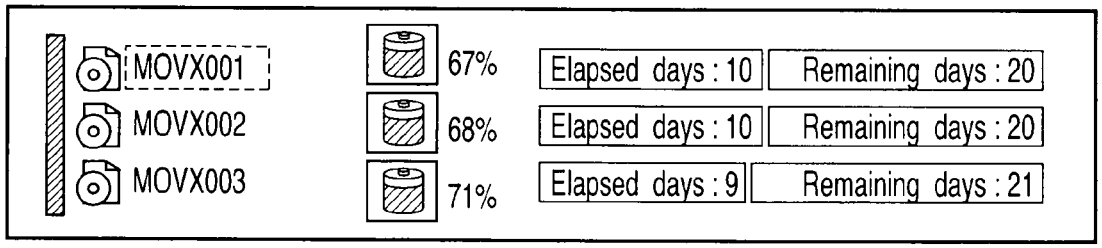
FIG. 14 is a view showing a third display example of the data remaining period according to the fifth embodiment of the present invention.

FIG. 14 is a view showing a third display example of a data remaining period. FIG. 14 shows a display example of informing a user of a percentage (%) of a remaining time from a reference time until a data remaining period passes, elapsed days from the reference time to the current time point, and remaining days from the current time point to a time point where the data remaining period passes in accordance with each piece of monitoring target data (file contents).

Moreover, as another display conformation, a percentage of a data remaining period may be displayed in units of the memory 8a or the entire storage device 7 rather than units of each piece of monitoring target data, for example.

In this case, for example, a reference time of the oldest monitoring target data is extracted from respective pieces of monitoring target data stored in the memory 8a or the storage device 7, a time point where the shortest data remaining period passes is extracted, and a level of the current time point that is present between the extracted reference to the extracted time point where the data remaining period passes is displayed.

Additionally, as still another display conformation, a data remaining period may be displayed as remaining days in units of the memory 8a or the entire storage device 7 rather than each piece of monitoring target data.

In this case, the smallest number of remaining days is extracted from remaining days of respective pieces of monitoring target data stored in the memory 8a or the storage device 7, and the extracted number of remaining days is displayed.

As yet another display conformation, for example, information indicating that whether data has been already transferred or not transferred to a secondary storage device (a permanent storage device) may be displayed in accordance with each piece of monitoring target data. In this case, the storage device 7 or the host device 1 manages the information indicating whether data has been already transferred or not transferred in a memory in accordance with each piece of monitoring target memory, and the controller 9 in the storage device 7 or the controller 2 in the host device 1 accesses this memory to judge whether the monitoring target data has been already transferred. Further, the storage device 7 may execute control concerning a data remaining period with respect to untransferred monitoring target data alone. Even in case of managing a data remaining period in units of the memory 8a or the storage device 7, untransferred data alone may be managed as explained above.

Using the display conformation according to this embodiment to display a data remaining period on the host device 1 side enables a user to readily grasp a data remaining period.

In this embodiment, a user's intuitive understanding can be matched with an actual situation of a data remaining period elapsed state.

Sixth Embodiment

In this embodiment, sampling data will be explained.

The sampling data may be data randomly extracted from monitoring target data 10 stored in a memory 8a, for example.

The sampling data may be selected by priority from a physical region with weak retention characteristic determined in advance or determined by learning in a physical region in the memory 8a storing the monitoring target data 10, for example.

For instance, when the number of pieces of sampling data selected from a region which is a physical region storing the monitoring target data 10 and a physical region with a weak retention characteristic is small, sampling data may be also selected from any other general region, the physical region with the weak retention characteristic and the other general region may determined as parent populations having different characteristics to create statistical data, and adjustment considering a characteristic difference may be executed to obtain a data remaining period. As the consideration on the characteristic difference, statistical data of the sampling data selected from the general region may be corrected to reduce reliability, thereby matching with the sampling data selected from the physical region with the weak retention characteristic, for example.

For instance, a physical region with the weak retention characteristic may be intentionally created or set in the memory 8a, data may be stored in this physical region with the weak retention characteristic, and the data stored in the physical region with the weak retention characteristic rather than the region storing the monitoring target data 10 in the memory 8a may be used as the sampling data. In this case, when storing the monitoring target data 10 in the memory 8a, the data is also written in the physical region with the weak retention characteristic.

As explained above, detecting a data remaining period by using the thus selected sampling data enables appropriately obtaining the data remaining period of the monitoring target data 10 as a large amount of data by using a small amount of sampling data.

It is to be noted that, in each of the foregoing embodiments, the controller 9 on the storage device 7 side or the controller 2 on the host device 1 side may include a refresh (rewriting, restoring, or reproduction of data) function in units of, e.g., the monitoring target data 10, the memory 8a, or the storage device 7 so that the controller 9 or the controller 2 can manually execute refreshing or automatically execute the same before elapse of a data remaining period. Here, when performing refreshing in units of the memory 8a or the storage device 7, a situation of a data remaining period may be obtained in accordance with each piece of monitoring target data, and refreshing may be performed with respect to monitoring target data that must be refreshed alone.

Moreover, when performing refreshing, an only region with a weak retention characteristic may be automatically selected to be refreshed in a power saving mode, or only data corresponding to a bottom of a distribution of each of various kinds of statistical data may be selected to be refreshed.

As a result, monitoring target data can be prevented from being lost when a data remaining period passes.

Each of the foregoing embodiments is not restricted to the above-explained structures as they are, and constituent elements may be modified and carried out without departing from the scope on an embodying stage.

For example, the clock section 6 may be provided on the storage device 7 side rather than the host device 1. Additionally, at least one of the reference time management section 20, the data size management section 21, the statistic calculating section 22, and the remaining period detecting section 23 may be provided on the host device 1 side. For example, at least one of the memories 8b to 8g may be likewise provided on the host device 1 side.

For example, at least one of the judgment section 29 and the remaining period detecting section 30 may be provided on the host device 1 side. Furthermore, for example, at least one of the memories 25b and 25c may be provided on the host device 1 side.

The processing that enables data remaining period data to be displayed in the various kinds of display conformations may be executed on the host device 1 side or may be executed on the storage device 7 side. Moreover, a data remaining period may be obtained based on a measurement result of sampling data on the host device 1 side instead of the storage device 7 or 24 side.

What is claimed is:

1. A data remaining period management device comprising:
   a statistic calculation unit that measures sampling data associated with monitoring target data stored in a storage device having a finite data remaining period and calculates sampling statistical data based on a measurement result of the sampling data; and
   a remaining period detection unit that obtains remaining period data indicative of a data remaining period of the monitoring target data based on predetermined remaining period characteristic data indicative of a characteristic that statistical data varies with elapse of data remaining period and the sampling statistical data calculated by the statistic calculation unit.

2. The device according to claim 1, wherein
   the sampling statistical data is at least one of an average value and a dispersion value of the measurement result of the sampling data,
   the remaining period characteristic data is indicative of a relationship between a data remaining period and at least one of an average value and a dispersion value; and
   the remaining period detecting unit compares at least one of the average value and the dispersion value in the sampling statistical data with at least one of the average value and the dispersion value in the remaining period characteristic data to obtain the remaining period data.

3. The device according to claim 1, wherein
   the statistic calculation unit measures the sampling data, obtains an error rate by dividing the number of pieces of error data included in the sampling data by a data length of the sampling data, calculates the error rate with respect to a plurality of pieces of sampling data, and obtains the number of pieces of sampling data with respect to a plurality of error rates to calculate the sampling statistical data,
   the remaining period characteristic data is indicative of a relationship pattern between the error rate and the number of pieces of data for each data remaining period, and
   the remaining period detecting unit obtains the remaining period data based on similarity of the number of pieces of sampling data for each error rate indicated by the sampling statistical data and the relationship pattern for each data remaining period indicated by the remaining period characteristic data.

4. The device according to claim 1, wherein
   the statistic calculation unit measures the sampling data, obtains an error rate by dividing the number of pieces of error data included in the sampling data by a data length of the sampling data, calculates the error rate with respect to a plurality of pieces of sampling data, counts the number of pieces of sampling data with respect to a plurality of error rates, and obtains a presence rate of the sampling data for each error rate by dividing the number of pieces of sampling data for each of the plurality of error rates by a total number of times of calculating the error rate to calculate the sampling statistical data,
   the remaining period characteristic data is indicative of a relationship pattern between the error rate and the data presence rate for each data remaining period, and
   the remaining period detecting unit obtains the remaining period data based on similarity of the presence rate of the sampling data for each error rate indicated by the sampling statistical data and the relationship pattern for each data remaining period indicated by the remaining period characteristic data.

5. The device according to claim 1, wherein
   the statistic calculation unit measures the sampling data, obtains an error rate by dividing the number of pieces of error data included in the sampling data by a data length of the sampling data, calculates the error rate with respect to a plurality of pieces of sampling data, counts the number of pieces of sampling data with respect to a plurality of error rates, and obtains a distribution representing a presence rate of the sampling data for each error rate by dividing the number of pieces of sampling data for each of the plurality of error rates by a total number of times of calculating the error rate to calculate the sampling statistical data,
   the remaining period characteristic data includes a limit value of the error rate, an allowable value of the presence rate with respect to the limit value, and a data remaining period for a shift value of the distribution, and
   the remaining period detection unit shifts a current distribution of the current error rate and the presence rate indicated by the sampling statistical data to a limit value side of the error rate to obtain a data remaining period that is set with respect to a shift value when the presence value with respect to the limit value exceeds the allowable value.

6. The device according to claim 1, wherein
   the statistic calculation unit measures the sampling data, obtains an error rate by dividing the number of pieces of error data included in the sampling data by a data length of the sampling data, calculates the error rate with respect to a plurality of pieces of sampling data, counts the number of pieces of sampling data with respect to a plurality of error rates, obtains a distribution indicative of a presence rate of the sampling data for each error rate by dividing the number of pieces of sampling data for each of the plurality of error rates by a total number of times of calculating the error rate, and calculates sampling statistical data at a time point where the monitoring target data is stored or updated and sampling statistical data at the present time, the remaining period characteristic data includes a limit value of the error rate and an allowable value of the presence rate with respect to the limit value, and the remaining period detection unit obtains a period required for a distribution of the sampling statistical data at the present time to change to a distribution where the presence rate of the sampling statistical data at the present time exceeds the allowable value with respect to the limit value of the remaining period characteristic data based on a state of a change from a distribution of the sampling statistical data at the time point where the monitoring target data is stored or updated to the distribution of the sampling statistical data at the present time, thereby acquiring a data remaining period.

7. A data remaining period management device comprising:

a count unit that obtains a first count value indicative of a number of a given data value with respect to sampling data associated with monitoring target data stored in a storage device including a plurality of memory cells each of which switches an ON operation and an OFF operation in accordance with comparison between a reading voltage supplied thereto and its own threshold voltage;

a shift unit that obtains a second count value indicative of a read number of the given data value when the reading voltage is shifted with respect to the sampling data; and a remaining period detection unit that obtains remaining period data indicative of a data remaining period of the monitoring target data based on remaining period characteristic data indicative of a characteristic that a value calculated from the first count value and the second count value varies with elapse of time and a value calculated from the first count value acquired by the count unit and the second count value acquired by the shift unit.

8. The device according to claim 7, wherein the remaining period characteristic data is indicative of a relationship between a reading failure rate and a data remaining period in which the data remaining period becomes shorter when the reading failure rate is increased, and the remaining period detection unit obtains a third count value as a value obtained by subtracting the second count value from the first count value, divides the third count value by the first count value to calculate a reading failure rate, and detects a data remaining period associated with the calculated reading failure rate based on the remaining period characteristic data.

9. The device according to claim 7, wherein the remaining period characteristic data is indicative of a relationship between a reading enabling rate and a data remaining period in which the data remaining period becomes shorter when the reading enabling rate is lowered, and the remaining period detection unit divides the second count value by the first count value to calculate a reading enabling rate, and detects a data remaining period associated with the calculated reading enabling rate based on the remaining period characteristic data.

* * * * *